United States Patent [19]
Yen

[11] Patent Number: 4,696,098
[45] Date of Patent: Sep. 29, 1987

[54] METALLIZATION TECHNIQUE FOR INTEGRATED CIRCUIT STRUCTURES

[75] Inventor: Yung-Chau Yen, San Jose, Calif.

[73] Assignee: Advanced Micro Devices, Inc., Sunnyvale, Calif.

[21] Appl. No.: 878,093

[22] Filed: Jun. 24, 1986

[51] Int. Cl.$^4$ ............... H01L 21/306; B44C 1/22
[52] U.S. Cl. ............... 437/187; 148/DIG. 20; 148/DIG. 51; 148/DIG. 158; 156/656; 357/68; 437/228
[58] Field of Search ............... 29/576 W, 578, 589, 29/590, 591; 148/DIG. 20, DIG. 51, DIG. 158; 156/656; 357/68

[56] References Cited

U.S. PATENT DOCUMENTS

| | | | |
|---|---|---|---|
| 4,076,860 | 2/1978 | Kuroda | 156/656 |
| 4,510,016 | 4/1985 | Chi et al. | 29/576 W |
| 4,533,431 | 8/1985 | Dargent | 156/656 |
| 4,584,761 | 4/1986 | Wu | 29/576 W |
| 4,586,980 | 4/1986 | Hirai et al. | 156/656 |
| 4,597,826 | 7/1986 | Majima et al. | 156/656 |
| 4,619,037 | 10/1986 | Taguchi et al. | 29/578 |
| 4,648,939 | 3/1987 | Maa et al. | 156/656 |
| 4,661,204 | 4/1987 | Mathur et al. | 156/656 |
| 4,662,989 | 4/1987 | Casey et al. | 156/656 |

FOREIGN PATENT DOCUMENTS

| | | | |
|---|---|---|---|
| 0090742 | 5/1983 | Japan | 29/589 |
| 0116751 | 7/1983 | Japan | 29/589 |
| 0145327 | 9/1983 | Japan | 29/589 |

OTHER PUBLICATIONS

Sachdev et al., "Tungsten Interconnects in VLSI", Proceedings of the 1985 Workshop, Oct. 7-9, 1985, Albuquerque, NM, pp. 161 & 171.

Primary Examiner—Brian E. Hearn
Assistant Examiner—William Bunch
Attorney, Agent, or Firm—Patrick T. King; John P. Taylor

[57] ABSTRACT

The invention discloses an improved process for forming one or more metal strips on an integrated circuit structure by wet etching of a metal layer which comprises forming an intermediate layer over the integrated circuit structure; forming slots in the intermediate layer; forming a metal layer over the intermediate layer; and wet etching the metal layer sufficiently to remove all metal in the slots while retaining metal on the intermediate layer between the slots to form the desired one or more metal strips. Multiple levels of metal strips may be formed in an integrated circuit structure using the method of the invention.

23 Claims, 12 Drawing Figures

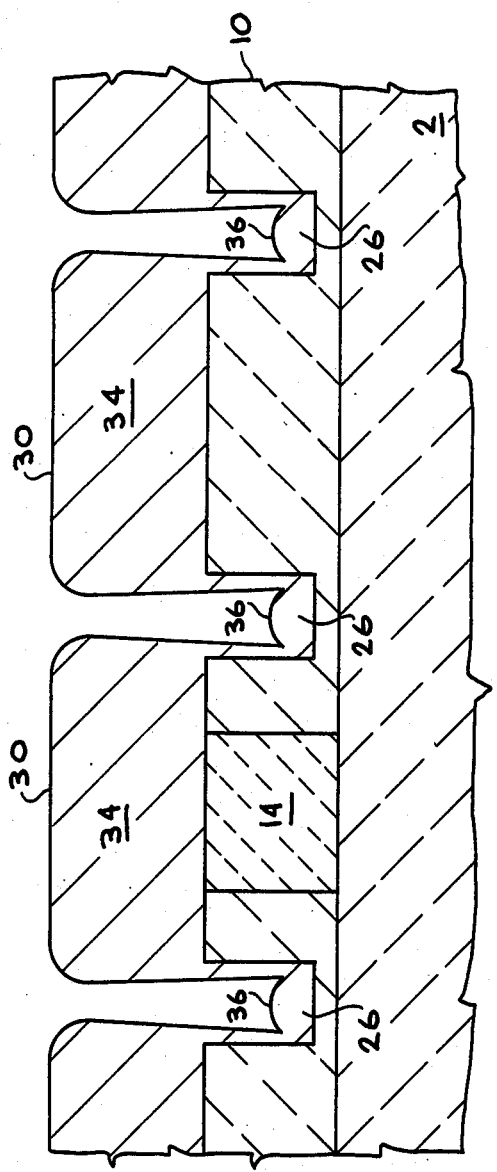
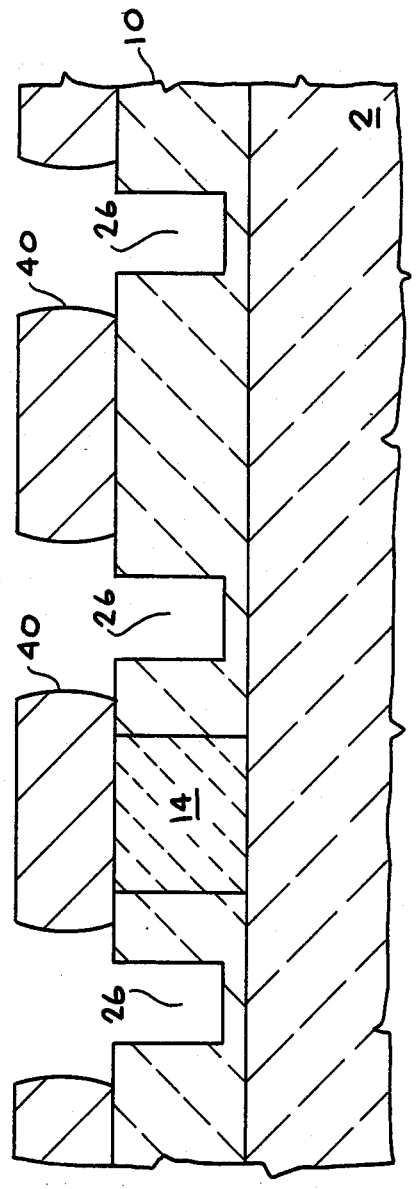

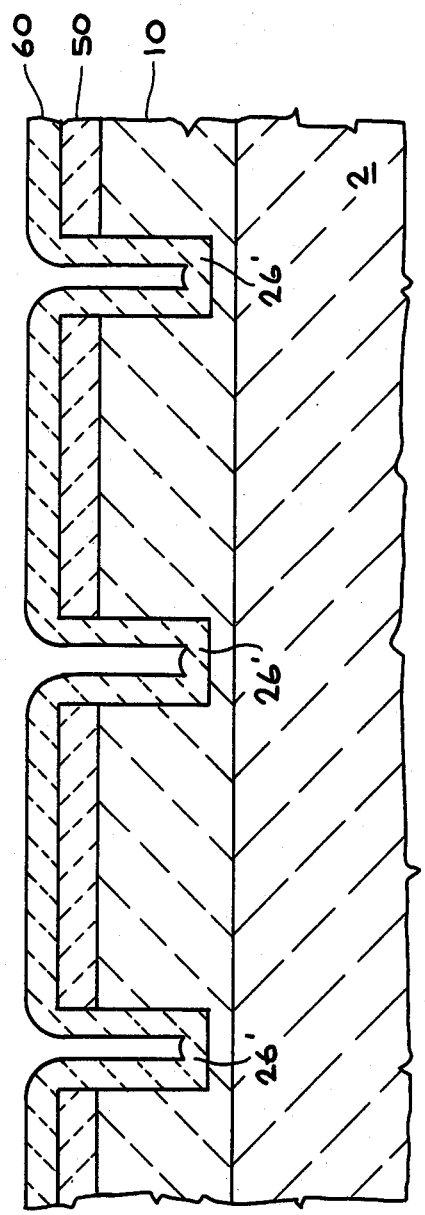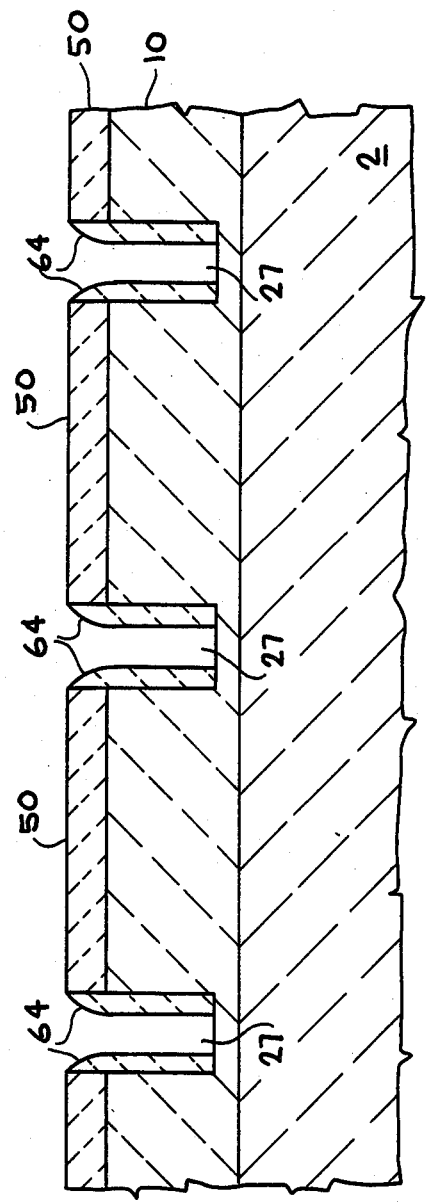

METALLIZATION TECHNIQUE FOR INTEGRATED CIRCUIT STRUCTURES

BACKGROUND OF THE INVENTION

1. Field of the Invention

This invention relates to the construction of integrated circuit structures. More particularly, this invention relates to an improved method for forming metallization strips on an integrated circuit structure.

2. Description of the Prior Art

In the construction of integrated circuit structures, metallization strips or lines are usually provided over an insulation layer to interconnect, through vias or contacts formed in the insulation layer, various circuit elements located below the insulation layer. Conventionally, such metals strips have been formed by first depositing a metal layer and then providing a pattern of photoresist over the metal layer. The metal layer was then selectively wet etched to remove exposed metal leaving metal strips beneath the photoresist.

However, as the size of the integrated circuit structures became smaller with very large scale integration (VLSI), the metallization strips, as well as the spacing between strips, became narrower. This, in turn, made it more difficult to use wet etching techniques to produce such narrow metal strips due to the difficulty in accurately controlling the extent of the wet etch because of the isotropic nature of wet etching. The prior art, therefore, adopted more costly but also more active dry etching techniques, such as reactive ion etching.

Other processes have also been used in the prior art, such as a so-called lift off process in which a removable mask, such as an organic material, is applied over an insulating surface to leave mask portions in the areas between the desired metal strips. A metallization layer is then applied over the patterned mask and the insulating layer. Finally, the removable mask is removed or "lifted" off the insulating layer together with those portions of the metallization layer located over the removable masks leaving the desired metal strips.

Yet other techniques have been proposed, such as the use of multiple metal layers and sputter etching as described in Reissue Patent No. 29,947.

However, from a standpoint of process economics, it would be preferable to use wet etching processing if the desired accuracy of the dimensions of the metal strips can be maintained.

SUMMARY OF THE INVENTION

It has now been discovered that metal strips may be produced by wet etching techniques using a selective metal deposition method wherein a metal layer is non-uniformly applied to an underlying layer and then partially removed by wet etching.

It is, therefore, an object of the invention to provide an improved method for forming metal strips in an integrated circuit structure using wet etching.

It is another object of the invention to provide an improved method for forming metal strips in an integrated circuit structure using wet etching of a metal layer of non-uniform thickness.

It is yet another object of the invention to provide an improved method for forming metal strips in an integrated circuit structure using wet etching of a metal layer of non-uniform thickness previously applied to an underlying layer having a pattern of slots therein.

It is a further object of this invention to provide a method wherein a metal layer of non-uniform thickness is wet etched to form thick metal strips not easily attainable using dry etching techniques.

It is a yet further object of the invention to provide a method for forming metal strips on an integrated circuit structure which comprises sputtering a metallization layer over an underlying layer having a pattern of slots previously formed therein corresponding to the desired spacing between the metal strips whereby less sputtered metal is deposited in the slots and subsequent wet etching of the metallization layer results in complete removal of the metal in the slots and formation of the desired metal strips.

These and other objects of the invention will be apparent from the following description and accompanying drawings.

BRIEF DESCRIPTION OF THE DRAWINGS

FIGS. 2–4 are vertical cross-section views of subsequent process steps in the practice of the invention.

FIGS. 5–8 are vertical cross-section views of sequential supplementary steps of an alternate embodiment of the method of the invention.

DESCRIPTION OF THE PREFERRED EMBODIMENTS

The invention provides an improved process for the production of fine metal strips or lines on high density (VLSI) integrated circuit structures utilizing wet etching techniques.

In accordance with the invention, slots are first formed in an intermediate layer generally conforming to the width of the desired spacing between metal strips. A metallization layer is then applied over the slotted intermediate layer using deposition techniques which will result in preferential deposition on the non-slotted surface portions of the intermediate layer, i.e., thinner deposition in the slots. The metallization layer is then subjected to a wet etch for a period of time sufficient to remove all the metal in the slot leaving the desired strips of metal between the slots.

Figure 1:
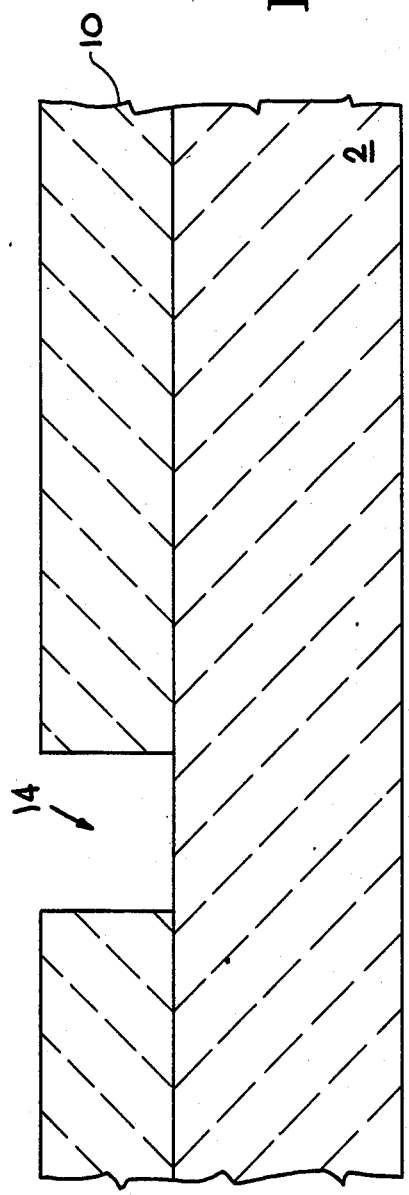
FIG. 1 is a vertical cross-section of an integrated circuit structure illustrating a first stage of the practice of the invention.

Referring now to the figures, and FIG. 1 in particular, an integrated circuit substrate 2 is shown which may comprise portions of various conductivity types as well as insulation portions. An intermediate layer 10 is shown which has been formed over substrate 2. Preferably, intermediate layer 10 comprises an insulation layer, for example, a silicon oxide layer. However, it is within the scope of this invention in its broadest aspect, to form intermediate layer 10 of a conductive material, e.g., doped polysilicon or the like.

Intermediate layer 10 is normally formed from an insulation material to permit the formation thereon of conductive portions, such as metal strips to interconnect various portions of the underlying integrated circuit substrate through vias or contact wells, such as via 14, formed through intermediate layer 10.

Figure 2:
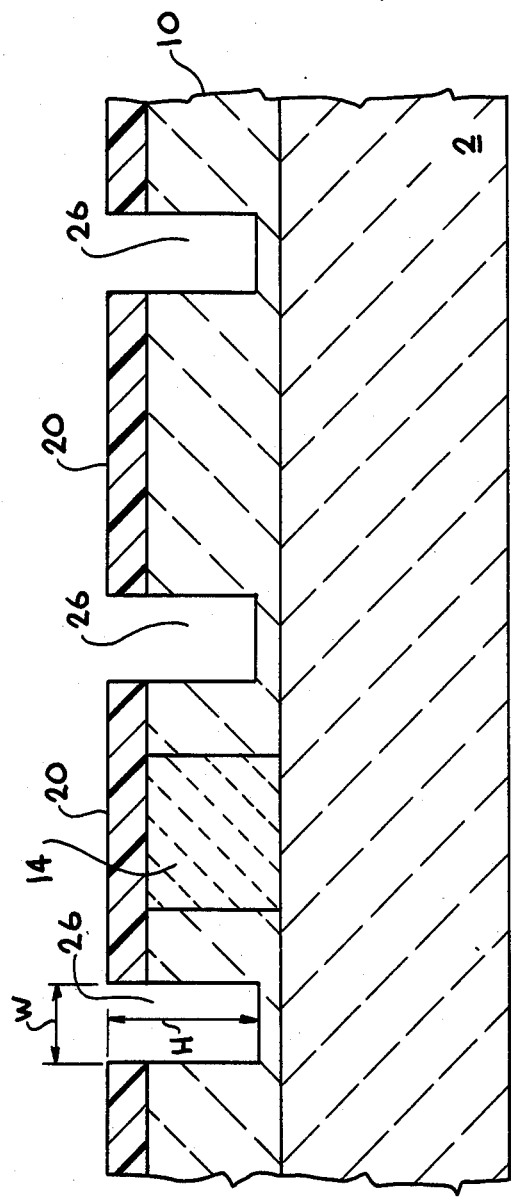

As shown in FIG. 2, intermediate layer 10 is patterned using a photoresist mask 20 to provide openings in the photoresist mask corresponding to the desired spacing between adjacent metal strips to be formed over layer 10. Layer 10 is etched through mask 20 to form slots 26 which extend down through at least a portion of the thickness of layer 10. When layer 10 comprises a conductive material, slot 26 will preferably extend completely through layer 10 to electrically insulate the subsequently formed metal strips from one another. However, in the preferred embodiment wherein layer 10 comprises an insulation material, slot 26 will preferably only extend through a portion of layer 10.

In any case, as will also be discussed below, the ratio of the height or depth of slot 10 with respect to its width (h/w), sometimes referred to herein as the "aspect ratio", must be controlled to, in turn, control the non-uniformity of the subsequently deposited metal layer.

If slot 26 is formed to extend completely through layer 10, it may be necessary to form an etch block layer between layer 10 and substrate 2. This may be done, for example, by first forming a silicon nitride layer over substrate 2 and then forming intermediate layer 10.

After formation of slots 26 in intermediate layer 10, photoresist mask 20 is removed and a metal layer 30 of non-uniform thickness is formed over layer 10 including slots 26 as shown in FIG. 3. Metal layer 30 is formed or deposited by an suitable technique which will results in the formation of thicker portions 34 of metal layer 30 over the surface of intermediate layer 10 between slots 26 than the thickness of metal formed at 36 within slots 26.

Metal layer 30 may comprise any conventional metal used in integrated circuit structures such as, for example, aluminum, platinum, gold, titanium, tungsten, molybdenum or the like. If desired, metal layer 30 may comprise a composite of two metal layers. For example, a layer of a refractory metal such as titanium may be sputtered over an aluminum layer to alleviate or reduce electromigration in the aluminum layer. Of course, if more than one metal layer is used, the wet etchant subsequently used to remove the metal in the slot must be capable of removing both metals or else two wet etchants will need to be employed.

The non-uniform thickness of metal layer 30 may be obtained by sputtering metal layer 30 on layer 10 using conventional metal sputtering techniques, but without substrate bias and without heating.

As will be noted from FIG. 3, the application of metal layer 30 over insulation layer 10 by a method, such as sputtering, results in the deposition of a thicker coating or layer of metal at 34, representing the area of intermediate layer 10 between slots 26, than the metal layer at 36 within slot 26.

Figure 12:
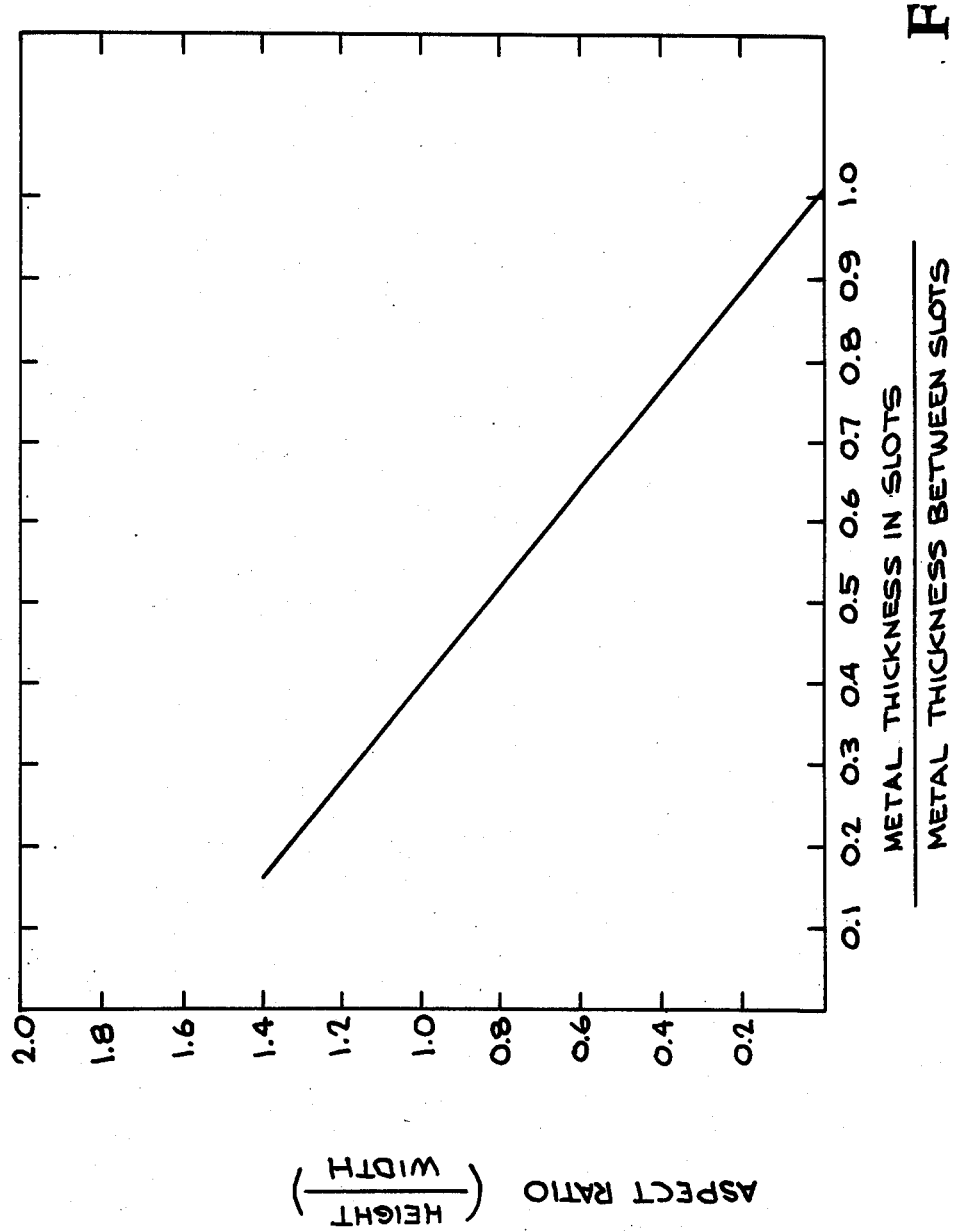
FIG. 12 is a graph showing the relationship between the aspect ratio of a vertical wall slot in the intermediate layer (h/w) versus the ratio of thickness of metal in the slot compared to metal deposited adjacent the slot prior to the wet etching step.

The difference in the relative thicknesses of metal layer 30 at 34 and 36 will depend upon two factors: first, the aspect ratio of slot 26, i.e., the height or depth of slot 26 divided by the width; and second, the amount of metal deposited. This relationship is shown in the graph of FIG. 12. Generally speaking, the higher the aspect ratio of slot 26, the smaller the thickness of the metal deposited in slot 26 relative to the amount of metal deposited on the surface of intermediate layer 10 adjacent the slot as illustrated in FIG. 3. It should be further noted, in this regard, that the side walls of slot 26 should be formed as close to vertical as possible to assist in achieving the desired non-uniform thickness of metal deposition over the structure.

Normally, intermediate layer 10 will be about 1 micron thick and, therefore, the depth of slot 26 will usually be from about 0.07 to 0.9 microns. It will be noted that the deeper the slot is, the higher will be the aspect ratio of the slot for any given width. The width of the slot may vary considerably as well and will depend upon the available lithography. Again, to achieve the desired high aspect ratio, the width of the slot should be as narrow as possible. Typically, the slot width will be about 0.5 to 1 microns to provide adequate separations between subsequently formed adjacent metal strips. While slot 26 may be formed wider than this, the width should be kept as small as possible since an aspect ratio (h/w) of at least 0.5, and preferably 1.0 or higher, is desirable to permit a large ratio between the thickness of the metal on the surface of layer 10 relative to the thickness of metal in the slot.

Thus, for example, using the graph of FIG. 12, when the aspect ratio is 0.5, the thicknesses of metal 36 in slot 26 to metal 34 on the unetched surface is about 0.7, e.g., 0.7 microns of metal 36 in slot 26 for 1 micron of metal 34 on the surface of layer 10. This, in turn, means that 0.7 microns of metal must be chemically etched away from metal layer 30 to completely remove all metal in slot 26 to provide the metal strips 40 of FIG. 4, which would be approximately 0.3 microns thick.

On the other hand, if slot 26 can be made narrower (or deeper) to raise the aspect ratio to 1, the ratio of metal 36 in slot 26 to metal 34 on the surface of layer 10 will decrease to about 0.4, e.g., 0.4 microns of metal 36 would deposit in slot 26 when 1 micron of metal 34 is sputtered on the surface of layer 10. Thus, removal of all of the metal 36 in slot 26 would necessitate wet etching of 0.4 microns of metal leaving 0.6 microns thick metal strips 40, i.e., twice as thick as when the aspect ratio of slot 26 was only 0.5.

It should be noted here, that the graph of FIG. 12 is based on a 1 micron thick layer of metal sputtered on the surface of layer 10 between the slots. To use the graph for layers thicker than 1 micron, the aspect ratio of the slot must be adjusted to compensate for the fact that metal is also depositing in the slot and therefore changing the aspect ratio of the slot.

For example, if 2 microns of metal were sputtered on the surface and the initial aspect ratio was 1, as in the above illustration, 0.4 microns would deposit in the slot during the period when the first micron was sputtered on the surface. To calculate how much additional metal would deposit in the slot during the subsequent sputtering of an additional micron on the surface, one would first calculate the new aspect ratio of the slot.

Thus, if the initial slot width was 1 micron and the initial slot depth was 1 micron (to provide an initial aspect ratio of 1), the new aspect ratio, after reducing the slot depth by 0.4 microns because of the metal already deposited in the slot and then adding 1 micron because of the additional thickness of metal sputtered on the surface adjacent the slot, would be 1.6 (1.6 microns depth/1 micron width). Referring to the graph of FIG. 12, it can be seen that an additional amount of metal of about 0.1 microns would deposit in the slot for an additional micron sputtered on the surface for a total of 0.5 microns in the slot and 2 microns on the surface.

After metal layer 30 is deposited by sputtering in accordance with the invention to the desired thickness, metal layer 30 is then etched using any common metal etchant for the particular metal to remove all of the metal in slot 26 leaving metal strips 40 on the top surface of intermediate layer 10 as shown in FIG. 4. For example, when using aluminum metal, a conventional metal etchant can be used containing phosphoric acid, acetic acid, nitric acid, and water such a 16:1:1:2 aluminum etchant commercially available from Ashland Chemical Company. The strength or concentration of whatever etchant is used should be moderate to permit more effective control of the amount of metal which is etched per unit of time.

The thickness of originally applied metal layer 30 should be sufficient to leave at least about 0.8 to 1 micron of metal remaining on the surfaces of intermediate layer 10 in the nonslot portions after etching resulting in metal strips 40 having a thickness of at least about 0.8 to 1 microns.

As previously stated, the purpose for forming the slots in intermediate layer 10 is to permit the the non-uniform application of a metal layer or layers wherein less metal is deposited in the bottom of the slots. To assist in achieving this non-uniformity, the aspect ratio, i.e., the depth to width ratio of the slot should be as large as possible. However, since the thickness of intermediate layer 10 is desirably not more than about 1 micron, for other reasons not related to this invention, obtaining higher aspect ratios for the slot usually must be obtained by narrowing the width of slot 26.

However, existing lithography restraints sometimes limit the minimum width to which slot 26 may be initially formed by direct etching of layer 10.

Figure 5:
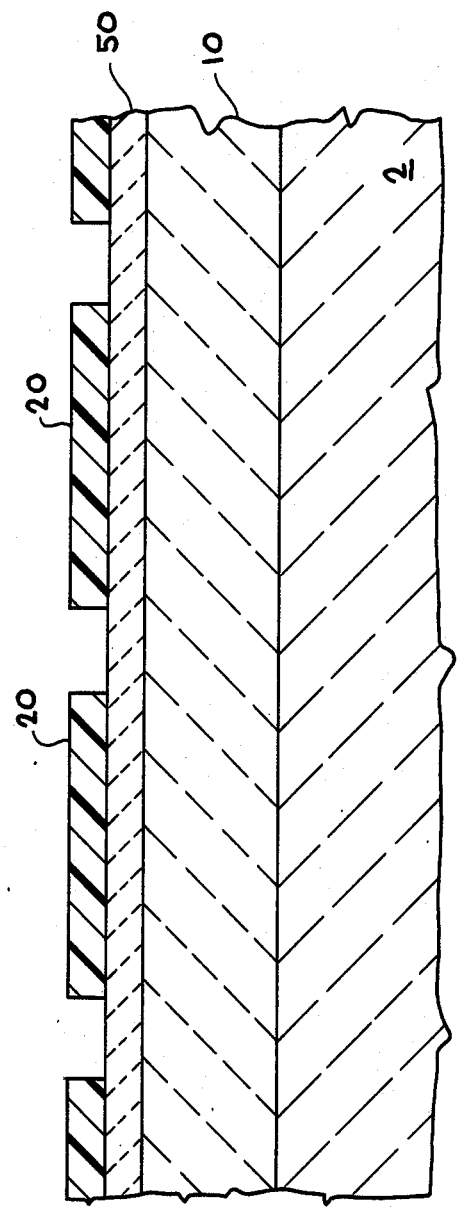

FIGS. 5–8 illustrate an alternate embodiment which makes it possible to provide a more narrow slot in layer 10 to thus increase the aspect ratio of the slot. In this embodiment, a layer of polysilicon 50 is first applied over intermediate layer 10 followed by application of the photoresist mask 20 as shown in FIG. 5.

Figure 6:
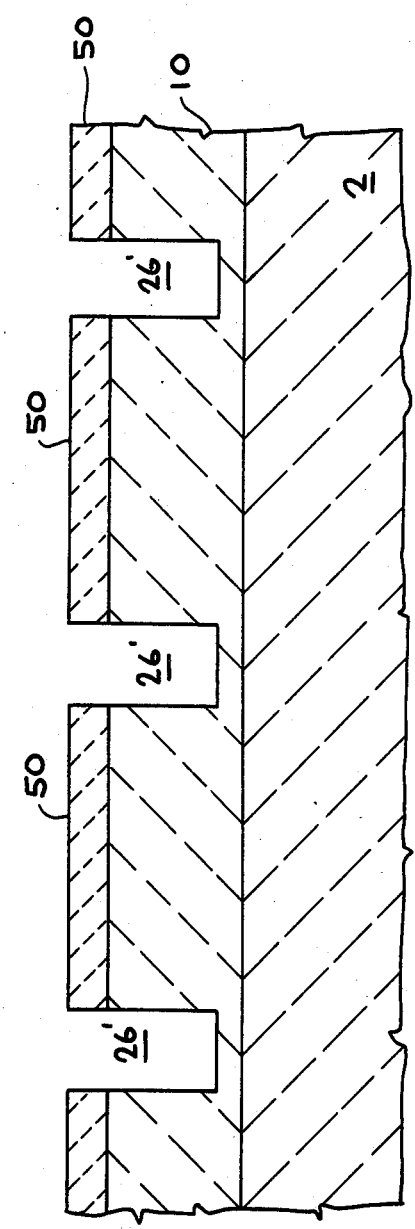

Slots 26' are then formed by first etching through polysilicon layer 50 and then etching layer 10 as shown in FIG. 6. A layer 60 of chemical vapor deposited (CVD) oxide of a thickness less than half the width of the slot is then formed over the polysilicon layer and in slots 26' as shown in FIG. 7. CVD layer 60 is then dry etched using a reactive ion etch (RIE) until polysilicon layer 50 is reached which than forms an etch block.

Etching of CVD oxide layer 60 down to polysilicon layer 50 will result in complete removal of CVD oxide from the bottom of slot 26' leaving CVD oxide shoulders 64. These shoulders 64, in effect, narrow the width of slot 26' thus enabling one to produce narrow width slots even where lithography does not permit such achievements.

After forming the narrow slot 27 shown in FIG. 8, metal layer 30 may be deposited and subsequently wet etched to form metal strips 40 in accordance with the invention as previously discussed with respect to FIGS. 3 and 4.

Figure 9:
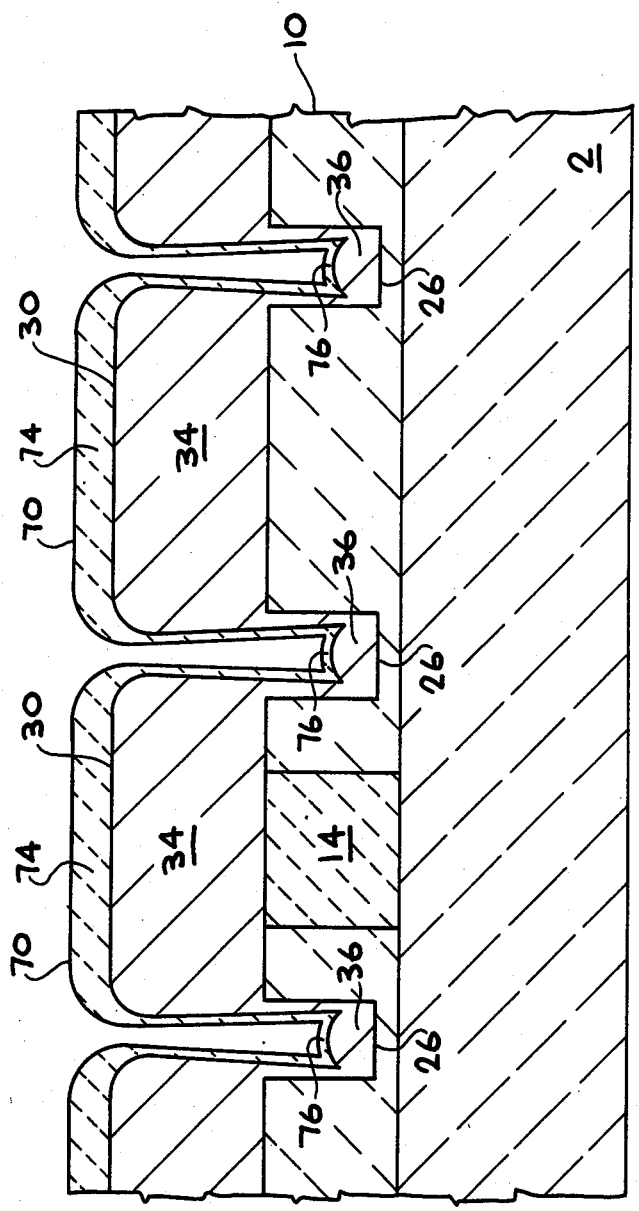
FIG. 9 is a vertical cros-section view of yet another embodiment of the invention.

In yet another embodiment of the invention illustrated shown in FIG. 9, after sputtering metal layer 30 over the structure as shown in FIG. 3, a further layer 70 of a different material such as an oxide could be sputtered over metal layer 30. This layer 70 would also selectively deposit less in the slot due to its application by sputtering. Wet etching of layer 70 would then result in removal of all of the material 76 in the slot over metal 36 while leaving some of the material at 74 over metal 34 to form a mask. Removal of metal 36 in slot 26 could then be done by a dry etch if desired followed by removal of the portions 74 of layer 70 over the metal strips 34.

Layer 70 could comprise any material which could be selectively etched down to metal 36 using an etching system would not substantially attack metal layer 30. Similarly, the subsequent etchant system used to remove metal 36 in the slots should not substantially attack the mask portions 74 of layer 70 over metal strips 34.

Figure 10:
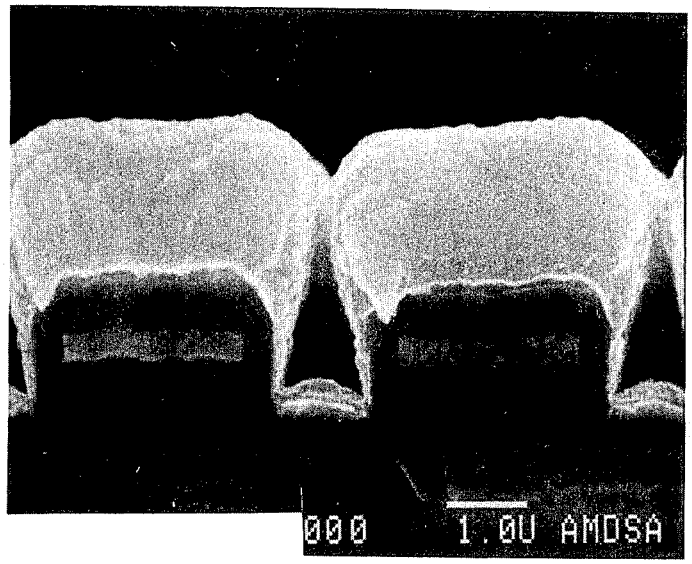
FIG. 10 is a photomicrograph showing the structure after deposition of the metallization layer by sputtering.

As an example of the practice of the invention, a series of slots were formed by first depositing a 0.25 micron layer of polysilicon over a 1 micron layer of oxide and then forming slots having a depth (height) of about 1 micron and a width of about 2 micron to provide an aspect ratio (h/w) of 0.5. A 0.8 micron thick layer of chemical vapor deposited oxide (CVD) was formed over the polysilicon layer. A layer of aluminum of 2 micron thickness in the areas between the slots was then sputtered over the remaining oxide to provide the structure shown in the photomicrograph of FIG. 10.

Figure 11:
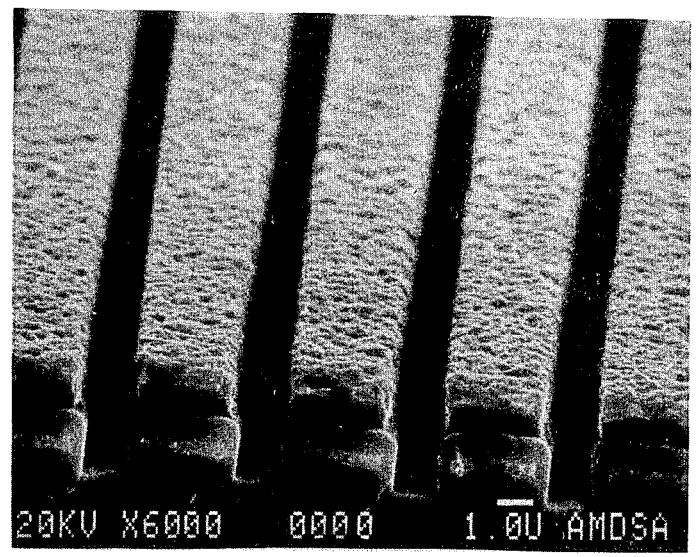
FIG. 11 is a photomicrograph showing the metal strips formed by wet etching the structure illustrated in the photomicrograph of FIG. 10.

The aluminum metal was then wet etched by immersion in 16:1:1:2 aluminum etch for about 60 seconds followed by washing and rinsing in deionized water to produce the structure shown in the photomicrograph of FIG. 11.

After production of metal strips 40 in accordance with the method of the invention as just described, the integrated circuit structure may be further processed in accordance with known processing techniques, e.g., planarization using a low melting glass or similar insulation material.

If multiple levels or layers of conductors separated by insulating layers are to be formed, the process of the invention may be repeated to form one or more additional levels of conductive layers. Care, of course, must be taken to ensure that the lower level of metal strips will not be exposed to the metal etchants used when forming the subsequent level or levels of metal strips.

Thus, the invention provides a process for forming metal strips on an integrated circuit structure using wet etching which is applicable to high density (VLSI) structures requiring fine metal strips or lines with narrow, yet accurate, spacing between the metal strips, i.e., high pitch. The formation of initial slots or grooves in the underlying layer of preselected aspect ratio together with the formation of a metal layer thereover using techniques which will result in controlled non-uniform thickness of the metal layer permits the use of low cost wet etching techniques to remove the metal deposited in the slots while retaining a sufficient thickness of metal on the surface of the underlying layer to provide the desired metal strips.

Having thus described the invention, what is claimed is:

1. An improved process for forming one or more metal strips on an integrated circuit structure by wet etching of a metal layer which comprises:
 (a) forming an intermediate layer over said integrated circuit structure;
 (b) forming slots in said intermediate layer;
 (c) forming a metal layer of non-uniform thickness over said intermediate layer; and (d) wet etching said metal layer sufficiently to remove all metal in said slots while retaining metal on said intermediate layer between said slots to form said desired one or more metal strips.

2. The process of claim 1 wherein said slots have a height to width ratio of at least 0.5 to assist in said formation of said non-uniform thickness of said metal layer.

3. The process of claim 2 wherein said slots have a height to width ratio of at least 1 to assist in said formation of said non-uniform thickness of said metal layer.

4. The process of claim 3 wherein said metal layer is formed over said intermediate layer by sputtering said metal onto said intermediate layer whereby a metal layer of non-uniform thickness will be formed which will be thinner in said slots than in the regions in between said slots.

5. The process of claim 4 wherein said sputtering is carried out without substrate bias and without substrate heating.

6. The process of claim 5 wherein said metal is selected from the class consisting of aluminum, gold, platinum, titanium, tungsten, and molybdenum.

7. The process of claim 5 wherein the amount of metal formed over said intermediate layer is sufficient to leave one or more metal strips of at least 0.5 microns thickness after said wet etching step.

8. The process of claim 7 wherein said metal is formed over said intermediate layer to a thickness of at least 1 micron in regions between said slots prior to said wet etching step.

9. The process of claim 8 wherein said slots have a width just prior to said metal sputtering step of not greater than 1 micron and a depth of at least 1 micron.

10. The process of claim 9 wherein said intermediate layer comprises an insulation material.

11. The process of claim 10 wherein said intermediate layer is silicon dioxide.

12. The process of claim 11 wherein said metal comprises aluminum.

13. The process of claim 11 wherein said metal comprises a composite of at least two adjoining metal layers.

14. The process of claim 11 which further comprises forming one or more vias through said silicon dioxide layer prior to forming said metal layer.

15. The process of claim 10 including the further steps of forming a polysilicon layer over said silicon dioxide layer prior to forming said slots; forming said slots through said polysilicon layer into said silicon dioxide layer; depositing a further layer of oxide over said structure; and anisotropically etching said further layer of oxide down to said polysilicon layer to leave oxide shoulders on the sidewalls of said slots to thereby narrow the width of said slots to raise the aspect ratio of said slots.

16. A method of forming one or more metal strips on an integrated circuit structure formed on a substrate which comprises:
(a) forming an insulating layer on an integrated circuit structure;
(b) forming one or more slots in said insulating layer each having a width of not greater than 1 micron and having a spacing therebetween not less than the desired width of said metal strips;
(c) apply a metallization layer over said insulating layer by means which will deposit metal non-uniformly to provide less metal in said slots; and
(d) wet etching said metallization layer sufficiently to remove the metal in said slots leaving metal strips on said insulating layer between said slots.

17. The method of claim 16 wherein said slots are formed with a height to width ratio of at least 1.

18. The method of claim 17 wherein said metallization layer is non-uniformly deposited over said insulating layer by sputtering said metal over said intermediate layer without substrate bias and without heating the substrate.

19. The method of claim 18 wherein said metallization layer comprises aluminum which is wet etched with an acid etch for a period of time sufficient to remove all of the aluminum metal in said slots.

20. A method for producing metal strips on an underlying substrate comprising an integrated circuit structure by wet etching which comprises:
(a) forming a silicon dioxide insulating layer over an integrated circuit structure;
(b) forming one or more contact openings through said insulating layer to underlying elements in said integrated circuit structure;
(c) forming one or more slots in said insulating layer having a depth less than the thickness of said insulating layer and a depth to width ratio of at least 0.5;
(d) sputtering aluminum over said intermediate layer without substrate bias and without heating said substrate to form an aluminum layer thereon of non-uniform thickness having a thicker portion on said intermediate layer between said slots and a thinner portion of said aluminum layer in said slots; and
(e) wet etching said aluminum for a period of time sufficient to remove all aluminum in said slots while retaining aluminum strips on the surface of said insulating layer having a thickness of at least 0.5 microns.

21. An improved process for forming one or more metal strips on an integrated circuit structure by wet etching of a metal layer which comprises:
(a) forming an intermediate layer over said integrated circuit structure;
(b) forming slots in said intermediate layer;
(c) sputtering a metal layer of non-uniform thickness over said intermediate layer; and
(d) sputtering a dissimilar material of non-uniform thickness over said metal layer;
(e) wet etching said dissimilar material sufficiently to remove all of said dissimilar material in said slots to thereby selectively expose said metal in said slot while leaving mask portions over said metal on the surface between said slots; and
(f) etching said exposed metal in said slots while retaining metal on said intermediate layer between said slots to form said desired one or more metal strips.

22. The process of claim 21 wherein said step of sputtering said dissimilar material over said sputtered metal layer comprises sputtering an oxide layer over said metal layer.

23. The process of claim 21 wherein said metal in said slot is selectively removed using dry etch means and said mask portions of said dissimilar material protect said metal portions thereunder from said dry etchant means.

* * * * *